(12) United States Patent
Chen et al.

(10) Patent No.: US 10,431,535 B2
(45) Date of Patent: Oct. 1, 2019

(54) ELECTRONIC PACKAGE AND METHOD FOR FABRICATING THE SAME

(71) Applicant: Siliconware Precision Industries Co., Ltd., Taichung (TW)

(72) Inventors: Jui-Feng Chen, Taichung (TW); Chia-Cheng Hsu, Taichung (TW); Wen-Jung Tsai, Taichung (TW); Chia-Cheng Chen, Taichung (TW); Cheng Kai Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/680,515

(22) Filed: Aug. 18, 2017

(65) Prior Publication Data

US 2018/0316083 A1 Nov. 1, 2018

(30) Foreign Application Priority Data

Apr. 28, 2017 (TW) .............................. 106114244 A

(51) Int. Cl.
*H01L 21/44* (2006.01)
*H01L 29/40* (2006.01)
*H01L 23/498* (2006.01)
*H01L 23/48* (2006.01)
*H01Q 1/22* (2006.01)

(52) U.S. Cl.
CPC ...... *H01L 23/49827* (2013.01); *H01L 23/481* (2013.01); *H01Q 1/2283* (2013.01); *H01L 2223/6677* (2013.01); *H01L 2224/16225* (2013.01); *H01L 2224/48091* (2013.01); *H01L 2224/48227* (2013.01); *H01L 2924/15311* (2013.01); *H01L 2924/181* (2013.01)

(58) Field of Classification Search
CPC ...... H01L 23/49827; H01L 2223/6677; H01Q 1/2283
USPC .......................... 257/621, 698, 776; 438/667
See application file for complete search history.

(56) References Cited

U.S. PATENT DOCUMENTS

| | | | |
|---|---|---|---|
| 8,981,906 B2 * | 3/2015 | Takeoka ............... | H01Q 1/2225 235/435 |
| 9,373,071 B2 * | 6/2016 | Liu .................. | G06K 19/07749 257/492 |
| 2017/0250466 A1 * | 8/2017 | Schlaffer ................. | H01Q 1/38 1/48 |

* cited by examiner

*Primary Examiner* — Calvin Lee
(74) *Attorney, Agent, or Firm* — Mintz Levin Cohn Ferris Glovsky and Popeo, P.C.; Peter F. Corless; Steven M. Jensen

(57) ABSTRACT

An electronic package and a method for fabricating the same are provided. The method includes forming an antenna structure in contact with one side of a circuit structure of a packaging substrate, and disposing an electronic component on the other side of the circuit structure. As such, the antenna structure is integrated with the packaging substrate, thereby reducing the thickness of the electronic package and improving the efficiency of the antenna structure.

16 Claims, 4 Drawing Sheets

US 10,431,535 B2

ELECTRONIC PACKAGE AND METHOD FOR FABRICATING THE SAME

CROSS-REFERENCE TO RELATED APPLICATION

This application claims under 35 U.S.C. § 119(a) the benefit of Taiwanese Patent Application No. 106114244 filed Apr. 28, 2017, the entire contents of which are incorporated herein by reference.

BACKGROUND

1. Technical Field

The present disclosure relates to electronic packages, and, more particularly, to an electronic package having an antenna structure and a method for fabricating the electronic package.

2. Description of Related Art

Along with the rapid development of portable electronic products, related products are developed toward the trend of high density, high performance and miniaturization. Accordingly, various types of packages with multi-functions integrated therein are developed to meet the high density and miniaturization requirements of electronic products. For example, mobile communication devices tend to have reduced size and improved performance. In addition, low-noise chips are developed to achieve a balance between semiconductor elements. Currently, wireless communication technologies are widely applied in various types of consumer electronic products to facilitate receiving/sending of wireless signals.

FIG. 1 is a schematic cross-sectional view of a conventional semiconductor communication module 1. An antenna substrate 11 is bonded to a semiconductor package 1a through a plurality of bonding elements 15, such as solder balls or an adhesive tape. The semiconductor package 1a has a packaging substrate 10, a plurality of semiconductor elements 13 disposed on an upper side of the packaging substrate 10 and electrically connected to the packaging substrate 10 through a plurality of conductive bumps 130 or bonding wires 130', and an encapsulant 14 formed on the upper side of the packaging substrate 10 to encapsulate the semiconductor elements 13 and the conductive bumps 130. The antenna substrate 11 is bonded to a lower side of the packaging substrate 10 through the bonding elements 15. Further, the antenna substrate 11 is made of an organic board such as a printed circuit board, which has an antenna wiring layer of metal for integrating an antenna function with the semiconductor elements 13.

However, during fabrication of the semiconductor communication module 1, the antenna substrate 11 is bonded to the packaging substrate 10 before the semiconductor elements 13 are disposed on the packaging substrate 10. As such, the bonding elements 15 need to be formed, which complicates the fabrication process and increases the fabrication cost.

Further, the antenna substrate 11 made of an organic board has a great thickness H, thereby hindering miniaturization of the semiconductor communication module 1 and adversely affecting the antenna efficiency of the semiconductor communication module 1.

Furthermore, tolerances from, for example, the fabrication of the antenna substrate 11, the adhesive tape and the solder balls may accumulate. Consequently, the thickness of the semiconductor communication module 1 cannot be accurately controlled and hence the miniaturization thereof is hindered.

Therefore, there is a need to provide an electronic package and a fabrication method thereof so as to overcome the above-described drawbacks.

SUMMARY

In view of the above-described drawbacks, the present disclosure provides an electronic package, which comprises: a packaging substrate having a circuit structure and an antenna structure, wherein the circuit structure has a first side and a second side opposite to the first side, and the antenna structure is in contact with the first side of the circuit structure; and at least one electronic component disposed on and electrically connected to the second side of the circuit structure.

The present disclosure further provides a method for fabricating an electronic package, which comprises: providing a packaging substrate having a circuit structure and an antenna structure, wherein the circuit structure has a first side and a second side opposite to the first side, and the antenna structure is in contact with the first side of the circuit structure; and disposing at least one electronic component on the second side of the circuit structure and electrically connecting the electronic component to the second side of the circuit structure.

In an embodiment, the circuit structure can comprise at least one dielectric layer and a circuit layer formed on the dielectric layer. In another embodiment, the circuit structure can comprise a core layer. In yet another embodiment, the circuit structure can comprise a plurality of dielectric layers having the same or different coefficients of thermal expansion (CTE). In still another embodiment, the circuit structure can comprise a plurality of dielectric layers having the same or different thicknesses. In also another embodiment, the circuit structure can comprise a plurality of circuit layers having the same or different layout areas.

In an embodiment, the antenna structure can comprise an insulating layer and an antennal layer formed on the insulating layer.

In an embodiment, an encapsulant is further formed on the second side of the circuit structure and encapsulates the electronic component.

In an embodiment, an insulating protection layer is further formed on the second side of the circuit structure and the antenna structure.

Therefore, since the antenna structure is directly formed in the packaging substrate, the present disclosure dispenses with the formation of bonding elements that are required in the prior art for bonding an antenna substrate to a packaging substrate, thereby simplifying the fabrication process and reducing the fabrication cost.

Further, by replacing the conventional antenna substrate such as an organic board with the insulating layer and the antenna layer that have a small thickness, the present disclosure effectively reduces the thickness of the electronic package so as to meet the miniaturization requirement and improve the antenna efficiency of the electronic package.

Furthermore, by dispensing with the conventional bonding of the antenna substrate to the packaging substrate, the present disclosure avoids tolerance accumulation. Hence, the thickness of the electronic package can be accurately controlled so as to meet the miniaturization requirement.

BRIEF DESCRIPTION OF DRAWINGS

FIG. 2B' is a schematic partial lower view of FIG. 2B; and

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 1:
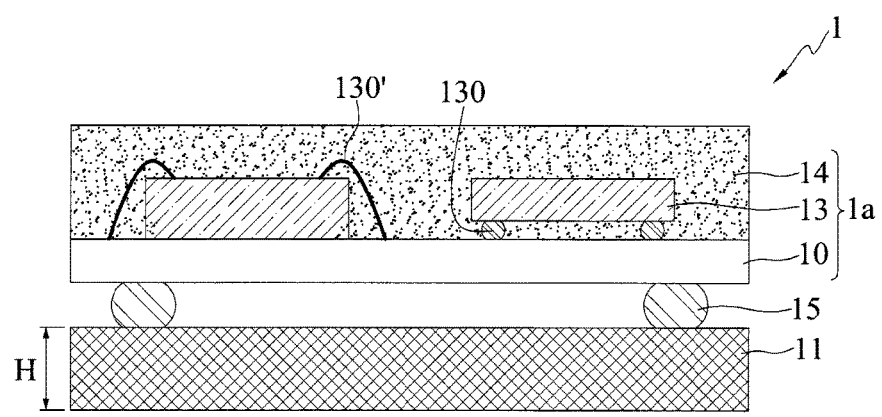
FIG. 1 is a schematic cross-sectional view of a conventional semiconductor communication module.
Figure 2A:
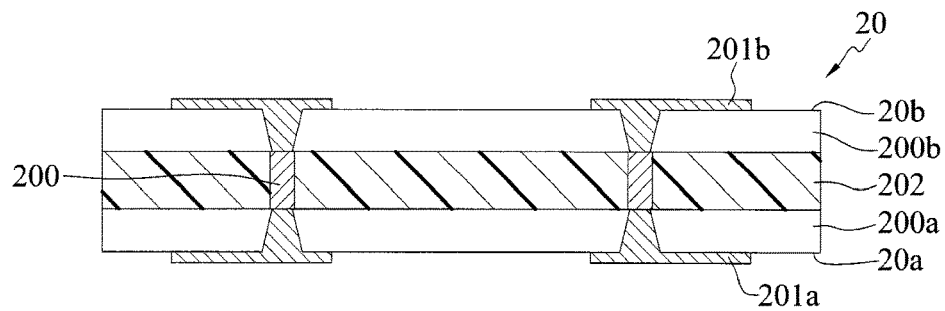
FIGS. 2A to 2D are schematic cross-sectional views showing a method for fabricating an electronic package according to the present disclosure.

Referring to FIG. 2A, a circuit structure 20 having a first side 20a and a second side 20b opposite to the first side 20a is provided.

In an embodiment, the circuit structure 20 includes: a core layer 202 having at least one conductive through hole 200, a plurality of dielectric layers 200a, 200b formed on upper and lower surfaces of the core layer 202, and a plurality of circuit layers 201a, 201b such as fan-out redistribution layers formed on the dielectric layer 200a, 200b. The circuit layers 201a, 201b are electrically connected through the conductive through hole 200. In an embodiment, the dielectric layers 200a, 200b are made of prepreg, polyimide, epoxy resin or glass fiber. The circuit layers 201a, 201b are made of metal such as copper. The number of the dielectric layers 200a, 200b and the circuit layers 201a, 201b can be varied according to the practical need.

Figure 2B:
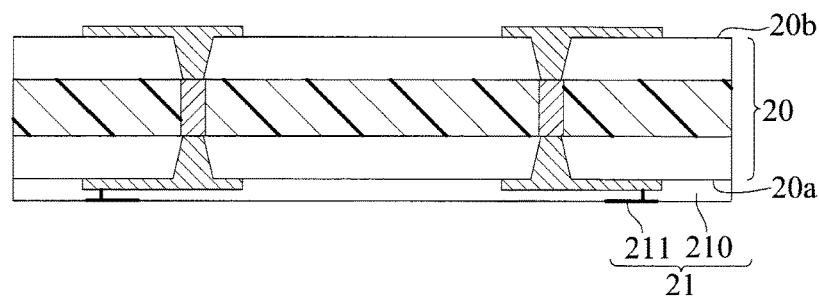
Figure 2B:
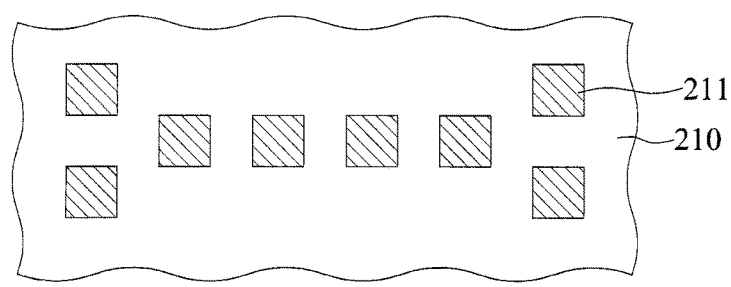

Referring to FIGS. 2B and 2B', an antenna structure 21 is formed on the first side 20a of the circuit structure 20.

In an embodiment, the antenna structure 21 has an insulating layer 210 formed on the dielectric layer 200a and an antenna layer 211 formed on the insulating layer 210. In an embodiment, the insulating layer 210 is made of prepreg, polyimide, epoxy resin or glass fiber. The insulating layer 210 and the dielectric layers 200a, 200b can be made of the same or different materials.

In an embodiment, the antenna layer 211 is made of metal such as copper. The antenna layer 211 and the circuit layers 201a, 201b can be made of the same or different materials. The antenna layer 211 can be formed by sputtering, evaporation, electroplating, electroless plating, chemical plating or foiling. Referring to FIG. 2B', in the process for fabricating the antenna structure 21, patterned recesses can be formed in the insulating layer 210 and a conductive material can be formed in the recesses to serve as the antenna layer 211. In an embodiment, a patterned conductive layer can be directly formed on the insulating layer 210 to serve as the antenna layer 211.

Figure 2C:
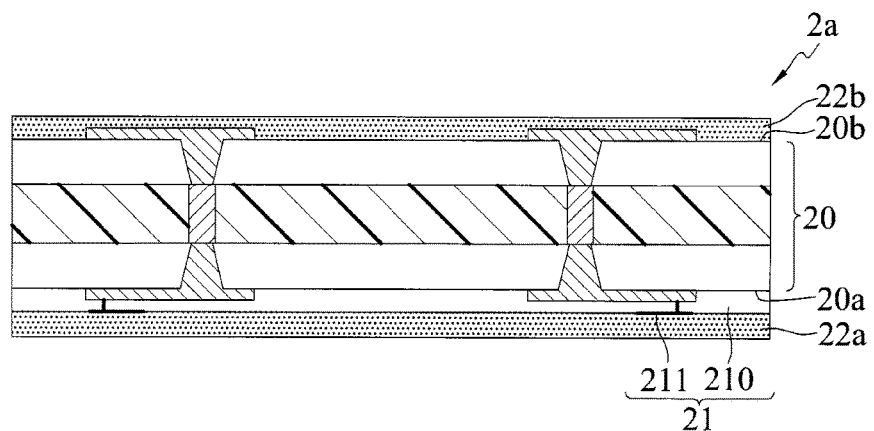

Referring to FIG. 2C, insulating protection layers 22a, 22b such as solder masks are formed on the antenna structure 21 and the second side 20b of the circuit structure 20, respectively, thus forming a packaging substrate 2a.

Figure 2D:
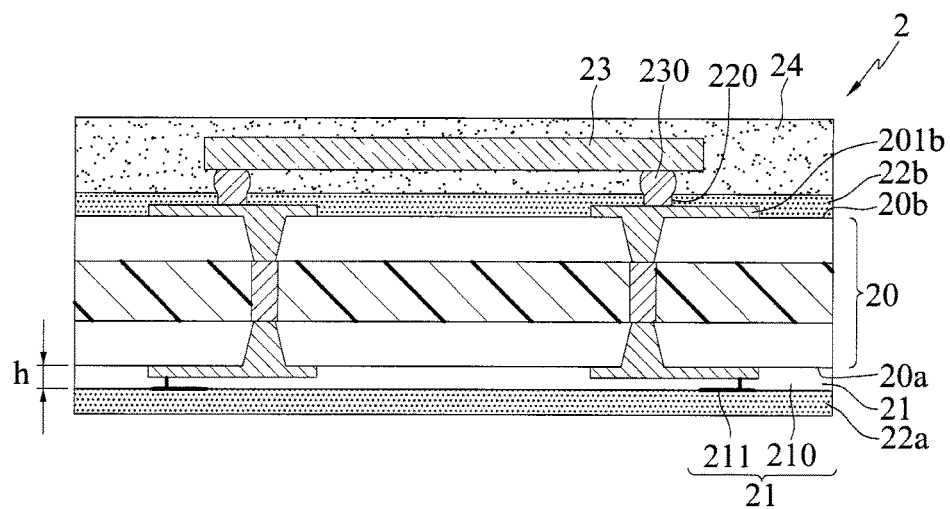

Referring to FIG. 2D, at least one electronic component 23 is disposed on the second side 20b of the circuit structure 20, and the antenna structure 21 and the electronic component 23 are disposed on different surfaces of the core layer 202. Also, an encapsulant 24 is formed on the second side 20b of the circuit structure 20 to encapsulate the electronic component 23.

In an embodiment, the electronic component 23 is an active element such as a semiconductor chip, a passive element, such as a resistor, a capacitor or an inductor, or a combination thereof. For example, the electronic component 23 is a semiconductor chip, which is bonded to the circuit layer 201b in a flip-chip manner through a plurality of conductive bumps 230. The conductive bumps 230 are made of, for example, a solder material. In an embodiment, a plurality of openings 220 are formed in the insulating protection layer 22b and thus a portion of the surface of the circuit layer 201b is exposed through the openings 220 for the conductive bumps 230 to be bonded therewith.

Further, the electronic component 23 can be electrically connected to the exposed surface of the circuit layer 201b through a plurality of bonding wires (not shown). In an embodiment, the electronic component 23 can be in direct contact with the circuit layer 201b. However, the manner in which the electronic component 23 is electrically connected to the wiring structure 20 is not limited to above-mentioned.

In an embodiment, the encapsulant 24 is made of, but not limited to, polyimide, a dry film, an epoxy resin or a molding compound.

Figure 3:
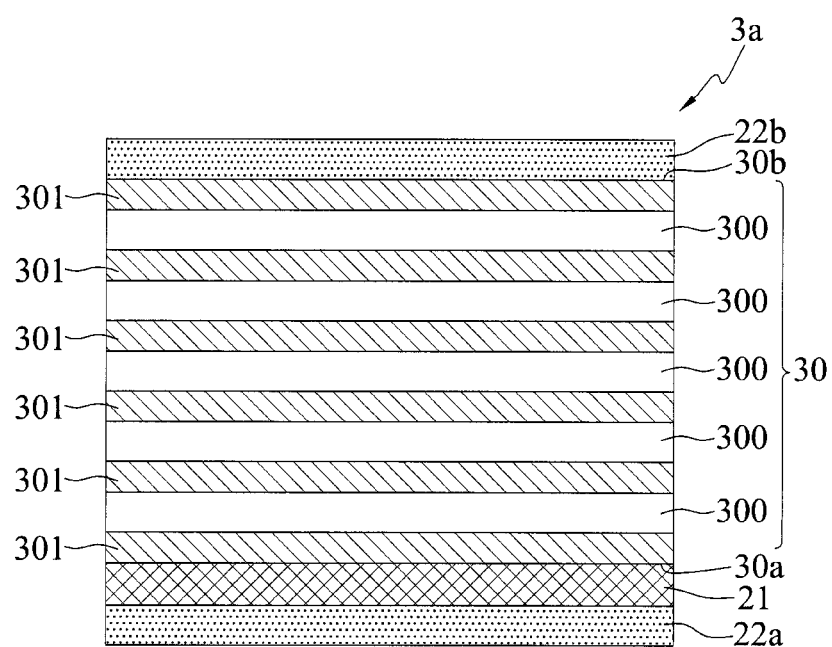
FIG. 3 is a schematic cross-sectional view showing another embodiment of FIG. 2C.

FIG. 3 is a schematic cross-sectional view of a packaging substrate 3a according to another embodiment of the present disclosure. Referring to FIG. 3, the circuit structure 30 of the packaging substrate 3a is a coreless structure, which includes a plurality of dielectric layers 300 and a plurality of circuit layers 301. The antenna structure 21 is formed on the first side 30a of the circuit structure 30, and the electronic component 23 is disposed on the second side 30b of the circuit structure 30.

Therefore, since the antenna structure 21 is directly formed in the packaging substrate 2a, 3a, the present disclosure dispenses with the formation of bonding elements that are required in the prior art for bonding an antenna substrate to a packaging substrate, thereby simplifying the fabrication process and reducing the fabrication cost.

Further, by replacing the conventional antenna substrate such as an organic board (having a thickness H) with the insulating layer 210 having a smaller thickness h, the present disclosure effectively reduces the thickness of the electronic package 2 so as to meet the miniaturization requirement and improves the antenna efficiency of the electronic package 2.

Furthermore, by dispensing with the conventional antenna substrate, the present disclosure avoids tolerance accumulation. Hence, by comparison with the conventional antenna substrate, the electronic package 2 has its thickness that can be accurately controlled so as to meet the miniaturization requirement.

In an embodiment, the dielectric layers 200a, 200b, 300 can have the same or different coefficients of thermal expansion (C 1B). The dielectric layers 200a, 200b, 300 can have the same or different thicknesses. The circuit layers 201a, 201b, 301 can have the same or different layout areas.

The present disclosure further provides an electronic package 2, which has: a packaging substrate 2a, 3a having a circuit structure 20, 30 and an antenna structure 21, wherein the circuit structure 20, 30 has a first side 20a, 30a and a second side 20b, 30b opposite to the first side 20a, 30a, and the antenna structure 21 is in contact with the first side 20a, 30a of the circuit structure 20, 30; and at least one electronic component 23 disposed on and electrically connected to the second side 20b, 30b of the circuit structure 20, 30.

In an embodiment, the circuit structure 20, 30 has at least one dielectric layer 200a, 200b, 300 and a circuit layer 201a, 201b, 301 formed on the dielectric layer 200a, 200b, 300. Further, the circuit structure 20 has a core layer 202.

In an embodiment, the antenna structure 21 has at least one insulating layer 210 and an antennal layer 211 formed on the insulating layer 210.

In an embodiment, the electronic package 2 further has an encapsulant 24 encapsulating the electronic component 23.

According to the present disclosure, the antenna structure is directly formed in the packaging substrate, thereby simplifying the fabrication process and reducing the fabrication cost.

Further, since the antenna structure in the packaging substrate has a small thickness, the present disclosure effectively reduces the thickness of the electronic package so as to meet the miniaturization requirement and improves the antenna efficiency of the electronic package.

Furthermore, by dispensing with the conventional antenna substrate, the present disclosure avoids tolerance accumulation. Hence, the thickness of the electronic package can be accurately controlled so as to meet the miniaturization requirement.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A method for fabricating an electronic package, comprising:
    providing a packaging substrate having a circuit structure and an antenna structure, wherein the circuit structure has a first side and a second side opposite to the first side, the circuit structure comprises at least one dielectric layer and a circuit layer formed on the dielectric layer, and the antenna structure is in contact with the first side of the circuit structure, without an antenna on the second side of the circuit structure; and
    disposing at least one electronic component on the second side of the circuit structure and electrically connecting the electronic component to the second side of the circuit structure, wherein the electronic component is a semiconductor chip, wherein the circuit structure further comprises a core layer.

2. The method of claim 1, wherein the circuit structure comprises a plurality of dielectric layers having different coefficients of thermal expansion or different thicknesses.

3. The method of claim 1, wherein the circuit structure comprises a plurality of dielectric layers having the same coefficient of thermal expansion or the same thickness.

4. The method of claim 1, wherein the packaging substrate further comprises an insulating protection layer formed on the second side of the circuit structure and the antenna structure.

5. The method of claim 1, wherein the antenna structure comprises an insulating layer and an antenna layer formed on the insulating layer.

6. The method of claim 1, further comprising forming an encapsulant on the second side of the circuit structure to encapsulate the electronic component.

7. The method of claim 1, wherein the circuit structure comprises a plurality of circuit layers having different layout areas.

8. The method of claim 1, wherein the circuit structure comprises a plurality of circuit layers having the same layout area.

9. An electronic package, comprising:
    a packaging substrate, comprising:
        a circuit structure having a first side and a second side opposite to the first side, wherein the circuit structure comprises at least one dielectric layer and a circuit layer formed on the dielectric layer; and
        an antenna structure in contact with the first side of the circuit structure, without an antenna on the second side of the circuit structure; and
    at least one electronic component disposed on and electrically connected to the second side of the circuit structure, wherein the electronic component is a semiconductor chip, wherein the circuit structure further comprises a core layer.

10. The electronic package of claim 9, wherein the circuit structure comprises a plurality of dielectric layers having different coefficients of thermal expansion or different thicknesses.

11. The electronic package of claim 9, wherein the circuit structure comprises a plurality of dielectric layers having the same coefficient of thermal expansion or the same thickness.

12. The electronic package of claim 9, wherein the packaging substrate further comprises an insulating protection layer formed on the second side of the circuit structure and the antenna structure.

13. The electronic package of claim 9, wherein the antenna structure comprises an insulating layer and an antenna layer formed on the insulating layer.

14. The electronic package of claim 9, further comprising an encapsulant formed on the second side of the circuit structure and encapsulating the electronic component.

15. The electronic package of claim 9, wherein the circuit structure comprises a plurality of circuit layers having different layout areas.

16. The electronic package of claim 9, wherein the circuit structure comprises a plurality of circuit layers having the same layout area.

* * * * *